US012555533B2

(12) United States Patent
Lee et al.

(10) Patent No.: US 12,555,533 B2
(45) Date of Patent: Feb. 17, 2026

(54) PIXEL AND DISPLAY DEVICE INCLUDING THE SAME

(71) Applicant: Samsung Display Co., LTD., Yongin-si (KR)

(72) Inventors: Se Hyun Lee, Yongin-si (KR); Kwi Hyun Kim, Yongin-si (KR); Dong Woo Kim, Yongin-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 0 days.

(21) Appl. No.: 18/893,407

(22) Filed: Sep. 23, 2024

(65) Prior Publication Data

US 2025/0182689 A1 Jun. 5, 2025

(30) Foreign Application Priority Data

Dec. 5, 2023 (KR) ........................ 10-2023-0174682

(51) Int. Cl.
*G09G 3/3233* (2016.01)
*H10K 59/121* (2023.01)
*H10K 59/131* (2023.01)

(52) U.S. Cl.
CPC ......... *G09G 3/3233* (2013.01); *H10K 59/121* (2023.02); *H10K 59/131* (2023.02); *G09G 2300/0819* (2013.01); *G09G 2300/0852* (2013.01); *G09G 2300/0861* (2013.01); *G09G 2320/043* (2013.01)

(58) Field of Classification Search
CPC ......... G09G 3/3233; G09G 2300/0819; G09G 2300/0852; G09G 2300/0861; G09G 2320/043; H10K 59/131; H10K 59/121
See application file for complete search history.

(56) References Cited

U.S. PATENT DOCUMENTS 11,551,617 B2 1/2023 Kimura et al.
2013/0249888 A1* 9/2013 Sugimoto .............. G09G 5/001 345/212
2018/0357964 A1* 12/2018 Shin ..................... G09G 3/3233

FOREIGN PATENT DOCUMENTS

KR 102297000 B1 9/2021

* cited by examiner

*Primary Examiner* — Stacy Khoo
(74) *Attorney, Agent, or Firm* — CANTOR COLBURN LLP

(57) ABSTRACT

A pixel includes: a first transistor including first and second electrodes connected to first and second nodes, respectively, and a gate electrode connected to a third node; a second transistor connected between a data line and the third node, and including a gate electrode; a third transistor connected between a first power line and the first node, and including a gate electrode connected to an emission control line; a fourth transistor including a first electrode connected to the second node, a second electrode connected to a third power line, and a gate electrode; and a light emitting element connected between the second node and a second power line. During an emission period, the second power voltage has a first voltage level. During a deterioration prevention period after the emission period, the second power voltage has a second voltage level. The second voltage level is higher than the first voltage level.

18 Claims, 9 Drawing Sheets

PIXEL AND DISPLAY DEVICE INCLUDING THE SAME

The application claims priority to Korean patent application number 10-2023-0174682, filed on Dec. 5, 2023, and all the benefits accruing therefrom under 35 U.S.C. § 119, the content of which in its entirety is herein incorporated by reference.

BACKGROUND

Field of Invention

Various embodiments of the present disclosure relate to a pixel and a display device including the pixel.

Description of Related Art

With the development of information technology, the importance of a display device, which is a connection medium between a user and information, has been emphasized. Owing to the importance of display devices, the use of various kinds of display devices, such as a liquid crystal display device and an organic light-emitting display device, has increased.

There has been development in head-mounted display devices ("HMDs"). The head-mounted display device (HMDs) are display devices, which allow a user to wear in the form of glasses or a helmet, and are used to create virtual reality ("VR") or augmented reality ("AR") experiences where the focus is formed at a close distance in front of the eyes of the user. Head-mounted display devices employ high-resolution panels, and accordingly, it is desirable to prevent deterioration of pixels that can be applied to high-resolution panels.

SUMMARY

Various embodiments of the present disclosure are directed to a pixel applicable to a high-resolution panel, and a display device including the pixel.

An embodiment of the present disclosure provides a pixel including: a first transistor including a first electrode connected to a first node, a second electrode connected to a second node, and a gate electrode connected to a third node; a second transistor connected between a data line and the third node, and including a gate electrode electrically connected to a first sub-gate line; a third transistor connected between a first power line to which a first power voltage is supplied, and the first node, and including a gate electrode electrically connected to an emission control line; a fourth transistor including a first electrode connected to the second node, a second electrode electrically connected to a third power line to which an initialization voltage is supplied, and a gate electrode electrically connected to a second sub-gate line; and a light emitting element connected between the second node and a second power line to which a second power voltage is supplied. During an emission period in which the light emitting element emits light at a luminance corresponding to a current supplied from the first transistor, the second power voltage has a first voltage level. During a deterioration prevention period after the emission period, the second power voltage has a second voltage level. The second voltage level is higher than the first voltage level.

In an embodiment, one frame period may include a horizontal period, the emission period, and the deterioration prevention period. During the deterioration prevention period, the third transistor and the second transistor may be set to a turn-off state, and the first transistor and the fourth transistor may be set to a turn-on state.

In an embodiment, a start time point of the deterioration prevention period may correspond to an end time point of the emission period. An end time point of the deterioration prevention period may correspond to an end time point of the frame period.

In an embodiment, the horizontal period may include a first period and a second period. During the first period, the first to the fourth transistors may be set to the turn-on state. During the second period after the first period, the third transistor may be set to the turn-off state, and the first transistor, the second transistor, and the fourth transistor may be set to the turn-on state.

In an embodiment, during the emission period after the horizontal period, the second transistor and the fourth transistor may be set to the turn-off state, and the first transistor and the third transistor may be set to the turn-on state.

In an embodiment, the second voltage level may be higher than a sum of a voltage level of the initialization voltage and a voltage level of a threshold voltage of the light emitting element.

In an embodiment, a ratio of the emission period to the frame period may be a value ranging from 0.1 to 0.4.

In an embodiment, each of the first to the fourth transistors may be a P-type transistor.

In an embodiment, the pixel may further include: a first capacitor connected between the first node and the third node; and a second capacitor connected between the second node and the third node.

An embodiment of the present disclosure provides a display device, including pixels connected to gate lines, data lines, and emission control lines. Among the pixels, a pixel positioned on an i-th pixel row (where i is an integer of 0 or more) and a j-th pixel column (where j is an integer of 0 or more) includes: a first transistor including a first electrode connected to a first node, a second electrode connected to a second node, and a gate electrode connected to a third node; a second transistor connected between a j-th data line among the data lines and the third node, and configured to be turned on when a first sub-gate signal having a turn-on level is supplied to a first sub-gate line of an i-th gate line among the gate lines; a third transistor connected between the first node and a first power line to which a first power voltage is supplied, and configured to be turned on when an emission control signal having the turn-on level is supplied to an i-th emission control line among the emission control lines; a fourth transistor including a first electrode connected to the second node, and a second electrode connected to a third power line to which an initialization voltage is supplied, and configured to be turned on when a second sub-gate signal having the turn-on level is supplied to a second sub-gate line of the i-th gate line among the gate lines; and a light emitting element connected between the second node and a second power line to which a second power voltage is supplied. During an emission period in which the light emitting element emits light at a luminance corresponding to a current supplied from the first transistor, the second power voltage has a first voltage level. After the emission period, the second power voltage has a second voltage level. The second voltage level is higher than the first voltage level.

In an embodiment, one frame period may include a horizontal period, the emission period, and a deterioration prevention period. During the deterioration prevention period, the third transistor and the second transistor may be set to a turn-off state, and the first transistor and the fourth transistor may be set to a turn-on state.

In an embodiment, a start time point of the deterioration prevention period may correspond to an end time point of the emission period. An end time point of the deterioration prevention period may correspond to an end time point of the frame period.

In an embodiment, the horizontal period may include a first period and a second period. During the first period, the first to the fourth transistors may be set to the turn-on state. During the second period after the first period, the third transistor may be set to the turn-off state, and the first transistor, the second transistor, and the fourth transistor may be set to the turn-on state.

In an embodiment, during the emission period after the horizontal period, the second transistor and the fourth transistor may be set to the turn-off state, and the first transistor and the third transistor may be set to the turn-on state.

In an embodiment, the second voltage level may be higher than a sum of a voltage level of the initialization voltage and a voltage level of a threshold voltage of the light emitting element.

In an embodiment, a ratio of the emission period to the frame period may be a value ranging from 0.1 to 0.4.

In an embodiment, each of the first to the fourth transistors may be a P-type transistor.

In an embodiment, the pixel may include: a first capacitor connected between the first node and the third node; and a second capacitor connected between the second node and the third node.

DETAILED DESCRIPTION

Figure 1:
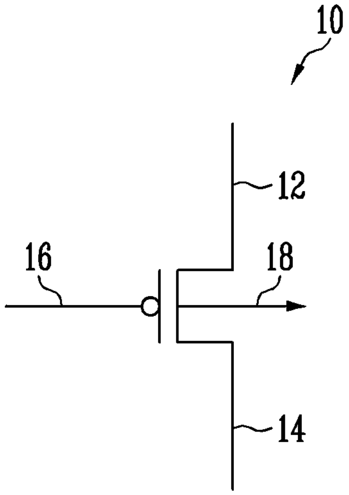
FIG. 1 is a diagram illustrating a transistor in accordance with an embodiment of the present disclosure.

Hereinafter, embodiments of the present invention will be described in detail with reference to the attached drawings, such that those skilled in the art can easily implement the present invention. The present disclosure may be embodied in various different forms without being limited to embodiments to be described herein.

In the drawings, portions unrelated to the present disclosure have been omitted to clarify the description of the present disclosure, and the same reference numerals are used throughout the different drawings to designate the same or similar components.

It will be understood that when an element is referred to as being "coupled" or "connected" to another element, it can be directly coupled or connected to the other element or intervening elements may be present therebetween. The terminology used herein is for the purpose of describing particular embodiments only and is not intended to be limiting.

In the specification, when an element is referred to as "comprising" or "including" a component, it does not preclude another component but may further include other components unless the context clearly indicates otherwise. "at least one of X, Y, and Z" and "at least one selected from the group consisting of X, Y, and Z" may be construed as X only, Y only, Z only, or any combination of two or more of X, Y, and Z (for instance, XYZ, XYY, YZ, and ZZ). As used herein, the term "and/or" can include any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

FIG. 1 is a diagram illustrating a transistor 10 in accordance with an embodiment of the present disclosure.

Referring to FIG. 1, the transistor 10 in accordance with an embodiment of the present disclosure may include a first electrode 12, a second electrode 14, a gate electrode 16, and a body electrode 18. In an embodiment, for example, the transistor 10 may be a metal-oxide-semiconductor field-effect transistor ("MOSFET"). The transistor 10 (e.g., an MOSFET) including the body electrode 18 is suitable for implementing a high-resolution pixel due to a reduced mounting area thereof.

The transistor 10 may be disposed on a silicon wafer. For example, a panel may be implemented by stacking layers such as a transistor layer, an emission layer, and a cover layer on the silicon wafer. However, the foregoing description is illustrative, and the transistor 10 may be disposed on various known substrates (e.g., a glass substrate).

The first electrode 12 of the transistor 10 may be set to a source electrode (or a drain electrode), and the second electrode 14 of the transistor 10 may be set to a drain electrode (or a source electrode). In the case where the transistor 10 includes the body electrode 18, a threshold voltage of the transistor 10 may be changed by body effect. The body effect refers to a change in the threshold voltage of the transistor 10 due to a voltage difference between the body electrode 18 and the first electrode 12 of the transistor 10.

Figure 2:
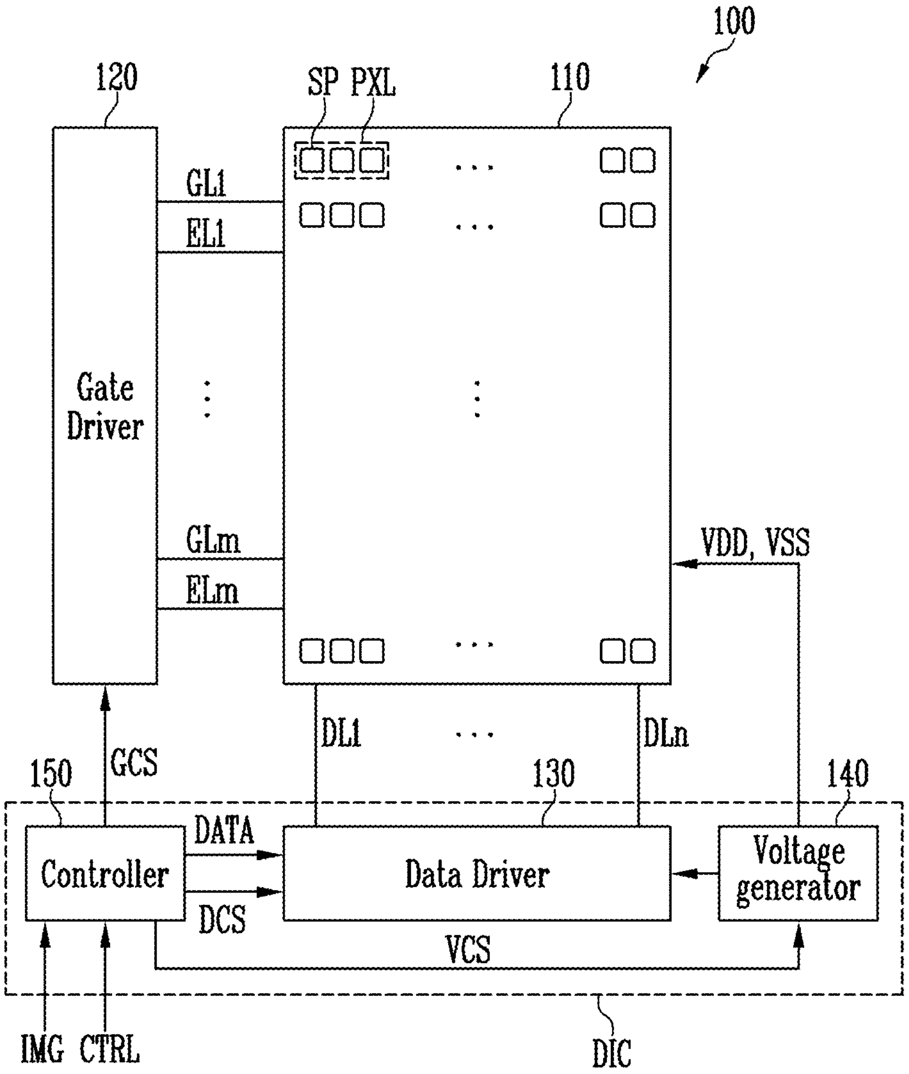
FIG. 2 is a block diagram illustrating a display device in accordance with embodiments of the present disclosure.

FIG. 2 is a block diagram illustrating an embodiment of a display device 100.

Referring to FIG. 2, the display device 100 may include a display panel 110, a gate driver 120, a data driver 130, a voltage generator 140, and a controller 150.

The display panel 110 may include sub-pixels SP. The sub-pixels SP may be connected to the gate driver 120 through first to m-th gate lines GL1 to GLm. The sub-pixels SP may be connected to the data driver 130 through first to n-th data lines DL1 to DLn.

Each of the sub-pixels SP may include at least one light emitting element configured to generate light. Accordingly, each of the sub-pixels SP may generate light in a specific color such as red, green, blue, cyan, magenta, or yellow. Two or more sub-pixels among the sub-pixels SP may form one pixel PXL. For example, as illustrated in FIG. 2, three sub-pixels may form one pixel PXL.

The gate driver 120 may be connected to sub-pixels SP arranged in a row direction through first to m-th gate lines GL1 to GLm. The gate driver 120 may output gate signals to the first to m-th gate lines GL1 to GLm in response to a gate control signal GCS. In embodiments, the gate control signal GCS may include a start signal instructing each frame to start, a horizontal synchronization signal for outputting gate signals in synchronization with a timing at which data signals are applied, and/or the like.

In embodiments, there may be further provided first to m-th emission control lines EL1 to ELm connected to the sub-pixels SP in the row direction. In this case, the gate driver 120 may include an emission control driver configured to control the first to m-th emission control lines EL1 to ELm. The emission control driver may operate under the control of the controller 150.

The gate driver 120 may be disposed on one side of the display panel 110. However, embodiments are not limited to the aforementioned example. For another example, the gate driver 120 may be divided into two or more drivers that are physically and/or logically distinguished from each other. The gate driver 120 may be disposed on a first side of the display panel 110 and a second side of the display panel 110 opposite to the first side. As such, the gate driver 120 may be disposed around the display panel 110 in various forms depending on embodiments.

The data driver 130 may be connected to sub-pixels SP arranged in a column direction through the first to n-th data lines DL1 to DLn. The data driver 130 may receive image data DATA and a data control signal DCS from the controller 150. The data driver 130 may operate in response to the data control signal DCS. In embodiments, the data control signal DCS may include a source start pulse, a source shift clock, a source output enable signal, and/or the like.

The data driver 130 may apply, using voltages from the voltage generator 140, data signals having grayscale voltages corresponding to the image data DATA to the first to n-th data lines DL1 to DLn. When a gate signal is applied to each of the first to m-th gate lines GL1 to GLm, data signals corresponding to the image data DATA may be applied to the data lines DL1 to DLm. Hence, the corresponding sub-pixels SP may generate light corresponding to the data signals. As a result, an image may be displayed on the display panel 110.

In embodiments, the gate driver 120 and the data driver 130 may include complementary metal-oxide semiconductor ("CMOS") circuit elements.

The voltage generator 140 may operate in response to a voltage control signal VCS provided from the controller 150. The voltage generator 140 is configured to generate a plurality of voltages and provide the generated voltages to components of the display device 100. For example, the voltage generator 140 may receive an input voltage from an external device provided outside the display device 100, adjust the received voltage, and regulate the adjusted voltage, thus generating a plurality of voltages.

The voltage generator 140 may generate a first power voltage VDD and a second power voltage VSS. The generated first and second power voltages VDD and VSS may be provided to the sub-pixels SP. The first power voltage VDD may have a relatively high voltage level. The second power voltage VSS may have a voltage level lower than the first power voltage VDD. In other embodiments, the first power voltage VDD or the second power voltage VSS may be provided by an external device of the display device 100.

In an embodiment, the voltage generator 140 may generate a second power voltage VSS having a first voltage level (V1 in FIG. 5), and a second power voltage VSS having a second voltage level (V2 in FIG. 5), under the control of the controller 150. Each of the first voltage level V1 and the second voltage level V2 may be lower than the voltage level of the first power voltage VDD. The second voltage level V2 may be higher than the first voltage level V1.

In addition, the voltage generator 140 may generate various voltages. For example, the voltage generator 140 may generate an initialization voltage to be applied to the sub-pixels SP. For example, during a sensing operation for sensing electrical characteristics of transistors and/or light emitting elements of the sub-pixels SP, a certain reference voltage may be applied to each of the first to n-th data lines DL1 to DLn. The voltage generator 140 may generate the reference voltage.

The controller 150 may control overall operations of the display device 100. The controller 150 may receive input image data IMG and a control signal CTRL for controlling an operation of displaying the input image data IMG from an external device. The controller 150 may provide a gate control signal GCS, a data control signal DCS, and a voltage control signal VCS, in response to the control signal CTRL.

The controller 150 may convert the input image data IMG to be suitable for the display device 100 or the display panel 110 and then output image data DATA. In embodiments, the controller 150 may align the input image data IMG to be suitable for the sub-pixels SP on a row basis and then output the image data DATA.

Two or more components of the data driver 130, the voltage generator 140, and the controller 150 may be mounted on a single integrated circuit. As illustrated in FIG. 2, the data driver 130, the voltage generator 140, and the controller 150 may be included in a driver integrated circuit DIC. In this case, the data driver 130, the voltage generator 140, and the controller 150 may be components that are functionally separated from each other in the single driver integrated circuit DIC. In other embodiments, at least one of the data driver 130, the voltage generator 140, and the controller 150 may be provided as a component separated from the driver integrated circuit DIC.

Figure 3:
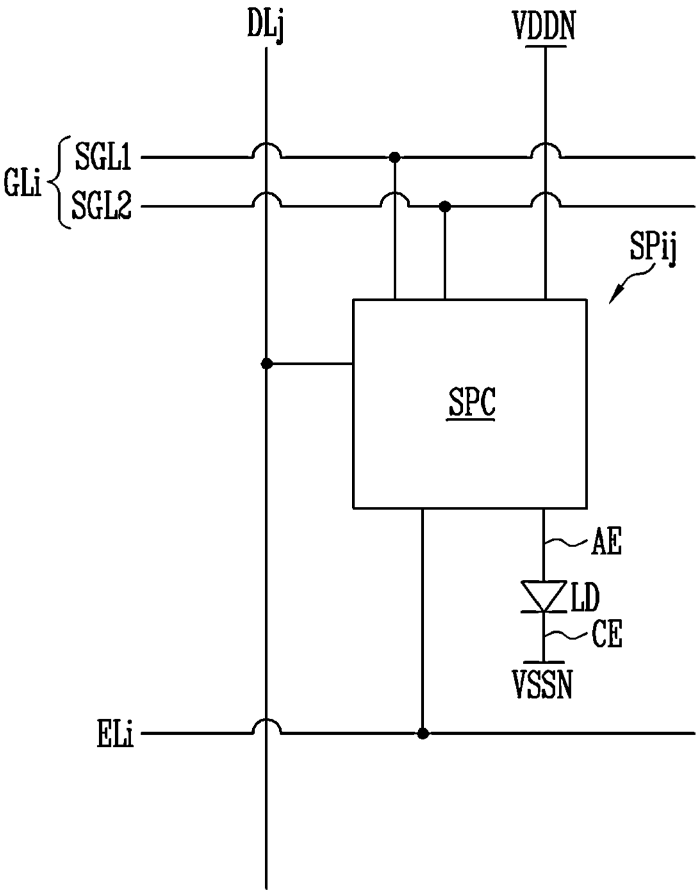
FIG. 3 is a block diagram illustrating an embodiment of any one of sub-pixels of FIG. 2.

FIG. 3 is a block diagram illustrating an embodiment of any one of the sub-pixels SP of FIG. 2. In FIG. 3, there is illustrated a sub-pixel SPij disposed on an i-th row (where i is an integer of 0 or more, particularly, an integer identical to or greater than 1 and identical to or less than m) and a j-th column (where j is an integer identical to or greater than 1 and identical to or less than n) among the sub-pixels SP of FIG. 2.

Referring to FIG. 3, the sub-pixel SPij may include a sub-pixel circuit SPC and a light emitting element LD.

The light emitting element LD is connected between a first power voltage node VDDN and a second power voltage node VSSN. Here, the first power voltage node VDDN may be a node provided to transmit the first power voltage VDD of FIG. 1. The second power voltage node VSSN may be a node provided to transmit the second power voltage VSS of FIG. 1.

An anode electrode AE of the light emitting element LD may be connected to the first power voltage node VDDN through the sub-pixel circuit SPC. A cathode electrode CE of the light emitting element LD may be connected to the second power voltage node VSSN. In an embodiment, for example, the anode electrode AE of the light emitting element LD may be connected to the first power voltage node VDDN through one or more transistors included in the sub-pixel circuit SPC.

The sub-pixel circuit SPC may be connected to an i-th gate line GLi among the first to m-th gate lines GL1 to GLm of FIG. 1, an i-th emission control line ELi among the first to m-th emission control lines EL1 to ELm of FIG. 1, and a j-th data line DLj among the first to n-th data lines DL1 to DLn of FIG. 1. The sub-pixel circuit SPC is configured to control the light emitting element LD in response to signals received through the aforementioned signal lines.

The sub-pixel circuit SPC may operate in response to a gate signal received through the i-th gate line GLi. The i-th gate line GLi may include one or more sub-gate lines. In embodiments, as illustrated in FIG. 2, the i-th gate line GLi may include first and second sub-gate lines SGL1 and SGL2. The sub-pixel circuit SPC may operate in response to gate signals received through the first and second sub-gate lines SGL1 and SGL2. As such, in the case where the i-th gate line GLi includes two or more sub-gate lines, the sub-pixel circuit SPC may operate in response to gate signals received through the corresponding sub-gate lines.

The sub-pixel circuit SPC may operate in response to an emission control signal received through the i-th emission control line ELi. In embodiments, the i-th emission control line ELi may include one or more sub-emission control lines. In the case where the i-th emission control line ELi includes two or more sub-emission control lines, the sub-pixel circuit SPC may operate in response to emission control signals received through the corresponding sub-emission control lines.

The sub-pixel circuit SPC may receive a data signal through a j-th data line DLj. The sub-pixel circuit SPC may store a voltage corresponding to the data signal in response to at least one of gate signals received through the first and second sub-gate lines SGL1 and SGL2. The sub-pixel circuit SPC may adjust the current flowing from the first power voltage node VDDN to the second power voltage node VSSN through the light emitting element LD according to the stored voltage, in response to the emission control signal received through the i-th emission control line ELi. Therefore, the light emitting element LD may emit light at a luminance corresponding to the data signal.

Figure 4:
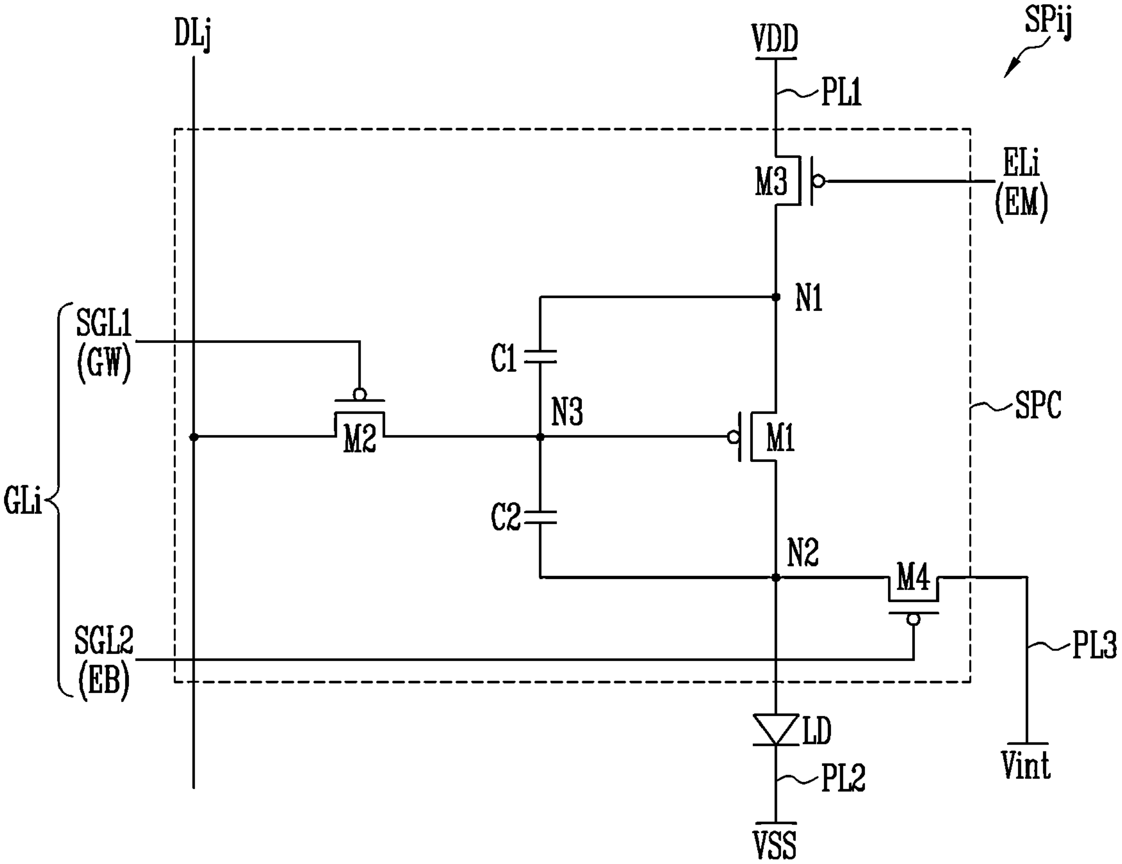
FIG. 4 is a circuit diagram illustrating an embodiment of the sub-pixel shown in FIG. 3.

FIG. 4 is a circuit diagram illustrating an embodiment of the sub-pixel SPij of FIG. 3.

Referring to FIG. 4, the sub-pixel SPij may include a sub-pixel circuit SPC and a light emitting element LD.

The light emitting element LD may be connected between a first power line PL1 and a second power line PL2. In an embodiment, for example, a first electrode (or an anode electrode) of the light emitting element LD may be electrically connected to the first power line PL1 via a second node N2, a first transistor M1, a first node N1, and a third transistor M3. A second electrode (or a cathode electrode) of the light emitting element LD may be electrically connected to the second power line PL2. The light emitting element LD may generate light of a certain luminance corresponding to the amount of the current that is supplied from the first power line PL1 to the second power line PL2 via the sub-pixel circuit SPC.

An organic light emitting diode may be selected as the light emitting element LD. Furthermore, an inorganic light emitting diode such as a micro light emitting diode ("LED") or a quantum dot light emitting diode may be selected as the light emitting element LD. The light emitting element LD may be an element formed of a combination of organic material and inorganic material. Although FIG. 4 illustrates that the sub-pixel SPij includes a single light emitting element LD, the sub-pixel SPij in an embodiment may include a plurality of light emitting elements LD. The plurality of light emitting elements LD may be connected in series, parallel or series-parallel to each other.

The sub-pixel circuit SPC may be connected to an i-th gate line GLi, an i-th emission control line ELi, and a j-th data line DLj. The sub-pixel circuit SPC may also be connected to the first power line PL1, the second power line PL2, and a third power line PL3. In an embodiment, the sub-pixel circuit SPC may be connected to the first power voltage node VDDN of FIG. 3 through the first power line PL1. The sub-pixel circuit SPC may be connected to the second power voltage node VSSN of FIG. 3 through the second power line PL2. The sub-pixel circuit SPC may be connected to a node configured to transmit an initialization voltage Vint through the third power line PL3.

The sub-pixel circuit SPC may include the first transistor M1, a second transistor M2, the third transistor M3, a fourth transistor M4, a first capacitor C1, and a second capacitor C2.

In an embodiment, each of the first to fourth transistors M1 to M4 may be a transistor including a body electrode 18. For example, each of the first to fourth transistors M1 to M4 may be formed of a metal oxide semiconductor field effect transistor (MOSFET). In this case, the first to fourth transistors M1 to M4 may be mounted in a relatively small area, thus enabling the sub-pixel SPij to be applied to a high-resolution panel. In an embodiment, the body electrode 18 of each of the first to fourth transistors M1 to M4 may be supplied with the first power voltage VDD. For example, the body electrode 18 of each of the first to fourth transistors M1 to M4 may be electrically connected to the first power line PL1.

In an embodiment, each of the first to fourth transistors M1 to M4 may be a P-type transistor. However, this is illustrative, and at least one of the first to fourth transistors M1 to M4 may be substituted with an N-type transistor in another embodiment.

The first transistor M1 may include a first electrode connected to the first node N1, and a second electrode connected to the second node N2. Here, the term "connected" implies being electrically linked or joined. A gate electrode of the first transistor M1 may be connected to a third node N3. The first node N1 may refer to a node to which a second electrode of the third transistor M3 is connected. The second node N2 may refer to a node to which the first electrode (i.e., anode) of the light emitting element LD is connected. The first transistor M1 may control, in response to the voltage of the third node N3, the amount of the current to be supplied from the first power line PL1 for the supply of the first power voltage VDD to the second power line PL2 for the supply of the second power voltage VSS via the light emitting element LD.

The second transistor M2 may be connected between the data line DLj and the third node N3. A gate electrode of the second transistor M2 may be electrically connected to the first sub-gate line SGL1. When a first sub-gate signal GW is supplied to the first sub-gate line SGL1, the second transistor M2 may be turned on to electrically connect the data line DLj with the third node N3.

A first electrode of the third transistor M3 may be electrically connected to the first power line PL1, and the second electrode of the third transistor M3 may be connected to the first node N1. A gate electrode of the third transistor M3 may be electrically connected to the emission control line ELi. The third transistor M3 may be turned on when an emission control signal EM is supplied to the emission control line ELi, and may be turned off when the emission control signal EM is not supplied thereto. If the third transistor M3 is turned off, the first power line PL1 and the first node N1 may be electrically disconnected.

The fourth transistor M4 may include a first electrode connected to the second node N2, and a second electrode electrically connected to the third power line PL3. A gate electrode of the fourth transistor M4 may be electrically connected to the second sub-gate line SGL2. When a second sub-gate signal EB is supplied to the second sub-gate line SGL2, the fourth transistor M4 may be turned on to electrically connect the second node N2 with the third power line PL3.

The first capacitor C1 may be connected between the first node N1 and the third node N3. The first capacitor C1 may be driven as a coupling capacitor, thus transmitting variance in voltage of the first node N1 to the third node N3. Furthermore, the first capacitor C1 may store the voltage of the third node N3.

The second capacitor C2 may be connected between the second node N2 and the third node N3. The second capacitor C2 may be driven as a coupling capacitor, thus transmitting variance in voltage of the second node N2 to the third node N3.

Figure 5:
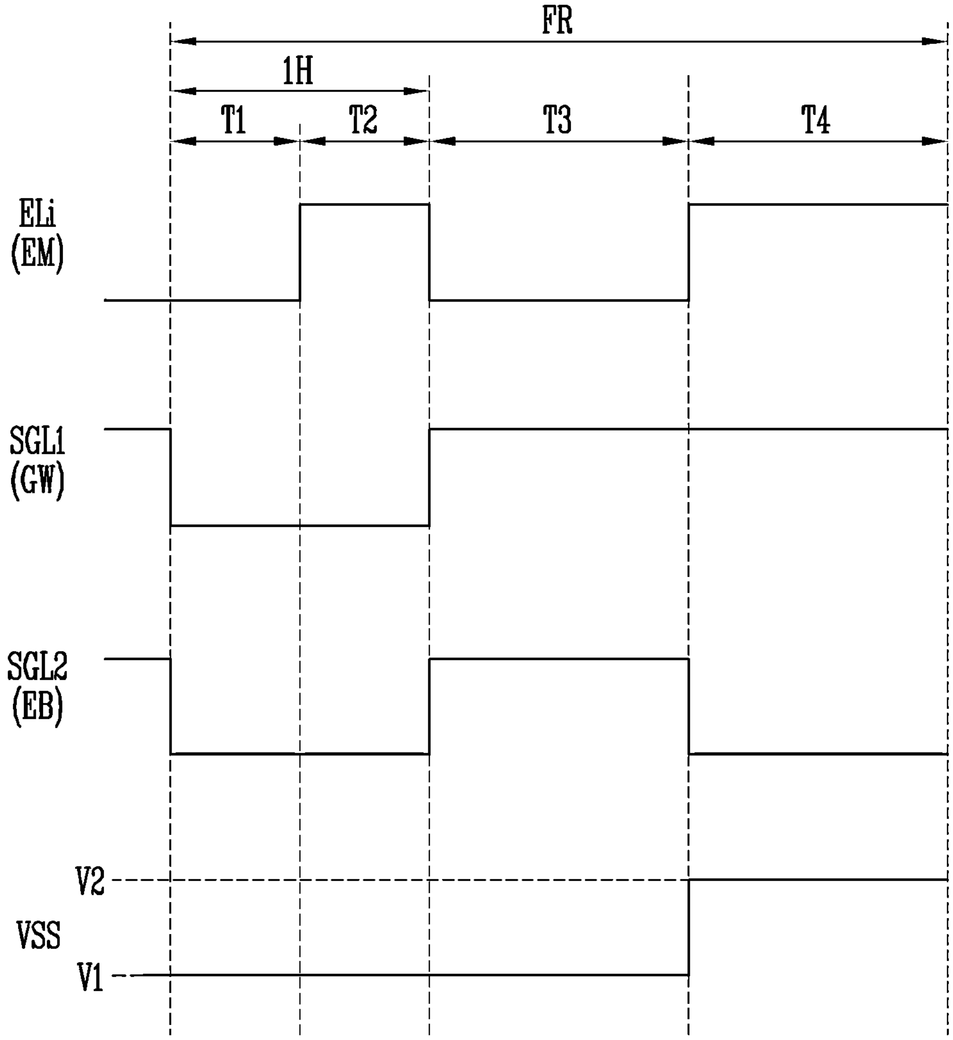
FIG. 5 is a wavelength diagram illustrating an embodiment of a method of driving the sub-pixel shown in FIG. 4.

FIG. 5 is a wavelength diagram illustrating an embodiment of a method of driving the sub-pixel shown in FIG. 4.

Referring to FIGS. 2, 4, and 5, there are illustrated signals supplied to the sub-pixel SPij from the gate driver 120, the data driver 130, and the voltage generator 140 of the display device 100 during the frame period FR. The frame period FR may refer to a period in which an image of one screen is displayed on the display panel 110. The frame period FR may include first to fourth periods T1 to T4.

A first sub-gate driver (not illustrated) of the gate driver 120 may supply a first sub-gate signal GW for setting the second transistor M2 to a turn-on state to the first sub-gate line SGL1 during a horizontal period 1H.

A second sub-gate driver (not illustrated) of the gate driver 120 may supply a second sub-gate signal EB for setting the fourth transistor M4 to a turn-on state to the second sub-gate line SGL2 during the horizontal period 1H and a fourth period T4.

The emission control driver (not illustrated) of the gate driver 120 may supply an emission control signal EM for setting the third transistor M3 to a turn-on state to the emission control line ELi during a first period T1 and a third period T3.

The data driver 130 may supply a voltage of a data signal to the data line DLj during the horizontal period 1H. The horizontal period 1H may be divided into a first period T1 and a second period T2.

Under the control of the controller 150, the voltage generator 140 may supply the second power voltage VSS having the first voltage level V1 to the second power line PL2 during the first to third periods T1 to T3, and may supply the second power voltage VSS having the second voltage level V2 to the second power line PL2 during the fourth period T4.

The first period T1 may be a period in which the first power voltage VDD is applied to the first node N1, the initialization voltage Vint is supplied to the second node N2, and the voltage of the data signal is supplied to the third node N3. During the first period T1, the light emitting element LD may be initialized. During the first period T1, the first capacitor C1 and the second capacitor C2 may be initialized and, simultaneously, may store the voltage level of the data signal supplied to the third node N3. The first period T1 may be referred to as an "initialization period" and a "data signal write period". A start time point of the first period T1 may correspond to a start time point of the frame period FR.

The second period T2 may be a period in which the initialization voltage Vint is supplied to the second node N2, and the voltage of the data signal is supplied to the third node N3. During the second period T2, a voltage corresponding to the threshold voltage of the first transistor M1 may be stored in the first capacitor C1. The second period T2 may be referred to as a "threshold voltage compensation period". A start time point of the second period T2 may correspond to an end time point of the first period T1.

During the third period T3, the first transistor M1 may control, in response to the voltage of the third node N3, the amount of the current flowing from the first power line PL1 for the supply of the first power voltage VDD to the second power line PL2 for the supply of the second power voltage VSS via the light emitting element LD. During the third period T3, the light emitting element LD may emit light at a luminance corresponding to the amount of the current supplied from the first transistor M1. The third period T3 may be referred to as an "emission period". A start time point of the third period T3 may correspond to an end time point of the second period T2.

The fourth period T4 may be a period in which the second power voltage VSS having the second voltage level V2 is supplied to the second electrode (i.e., cathode) of the light emitting element LD through the second power line PL2. The second voltage level V2 of the second power voltage VSS may be higher than the sum of the voltage level of the initialization voltage Vint and the threshold voltage of the light emitting element LD. As the second power voltage VSS having the second voltage level V2 is supplied to the second electrode (i.e., cathode) of the light emitting element LD through the second power line PL2, charges trapped in the light emitting element LD may be detrapped. Accordingly, deterioration of the light emitting element LD due to high current density may be effectively prevented. The second voltage level V2 of the second power voltage VSS may be referred to as a "reverse bias voltage". The fourth period T4 may be referred to as a "deterioration prevention period" or a "blank period". A start time point of the fourth period T4 may correspond to an end time point of the third period T3. An end time point of the fourth period T4 may correspond to an end time point of the frame period FR.

In an embodiment, a duty ratio of the third period T3 may have a value ranging from 0.1 to 0.4. The duty ratio may be a ratio of the third period T3 to the frame period FR. In the case where the duty ratio of the third period T3 has a value ranging from 0.1 to 0.4, the effect of preventing deterioration in the fourth period T4 may be increased. The duty ratio may be a rational number.

FIGS. 6 to 9 are circuit diagrams illustrating operation processes of the sub-pixel in response to signals of FIG. 5. A sub-pixel circuit SPC of FIGS. 6 to 9 may correspond to the sub-pixel circuit SPC of FIG. 4.

Figure 6:
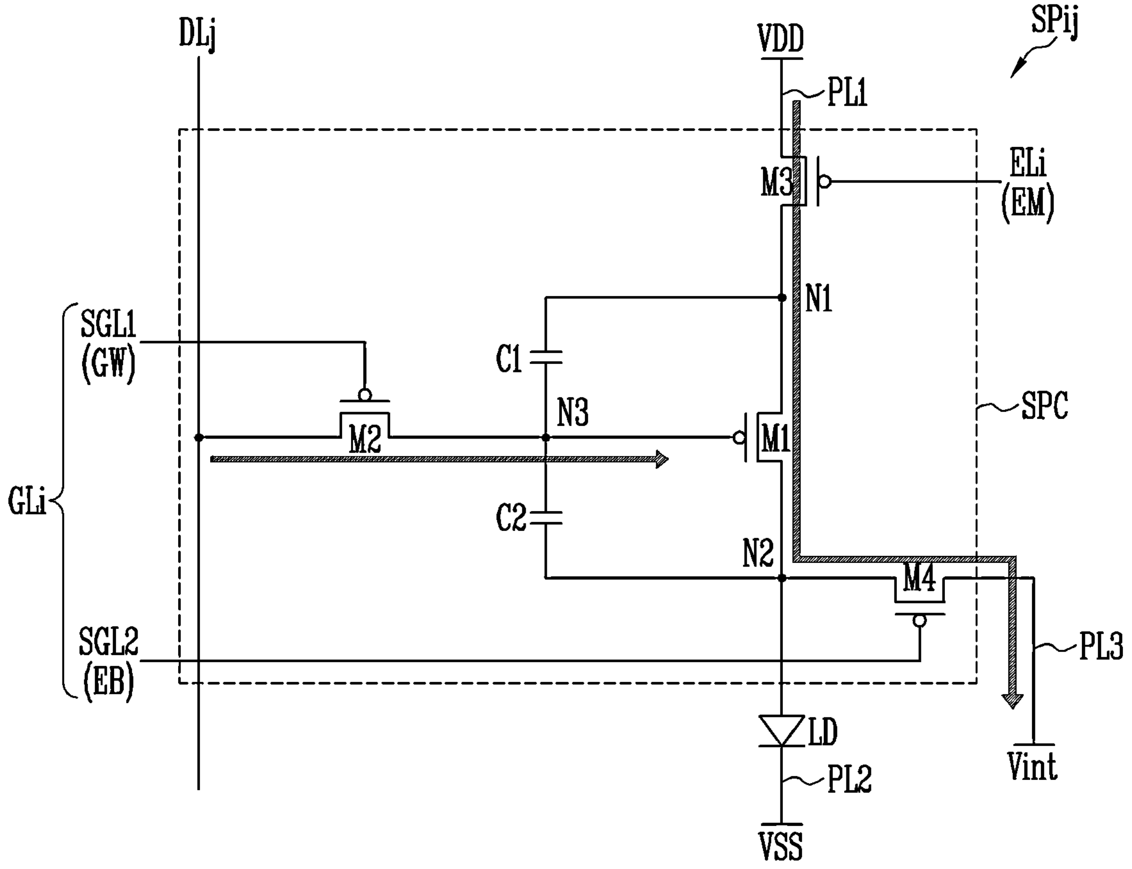
FIGS. 6 to 9 are circuit diagrams illustrating operation processes of the sub-pixel in response to signals of FIG. 5.

Referring to FIG. 6, during the first period T1, a first sub-gate signal GW for setting the second transistor M2 to a turn-on state is supplied to the first sub-gate line SGL1, and a second sub-gate signal EB for setting the fourth transistor M4 to a turn-on state is supplied to the second sub-gate line SGL2. Furthermore, during the first period T1, an emission control signal EM for setting the third transistor M3 to a turn-on state is supplied to the emission control line ELi. If the third transistor M3 is turned on, the first power voltage VDD is supplied to the first node N1.

If the second transistor M2 is turned on, the voltage of the data signal is supplied from the data line Dj to the third node N3. Here, the first capacitor C1 may be initialized by the voltage of the data signal and the first power voltage VDD. For example, the first capacitor C1 may charge the voltage of the data signal and a voltage corresponding to the first power voltage VDD regardless of a voltage charged in a preceding period (or a preceding frame period) during the first period T1.

If the fourth transistor M4 is turned on, the initialization voltage Vint is supplied to the second node N2. If the initialization voltage Vint is supplied to the second node N2, the light emitting element LD may be initialized. For example, if the initialization voltage Vint is supplied, parasitic capacitance (not illustrated) of the light emitting element LD may be discharged. Here, the initialization power Vint may be set to a voltage at which the light emitting element LD is turned off (or does not emit light). As a result, the light emitting element LD may be set to a non-emission state.

The second capacitor C2 may be initialized by the voltage of the data signal supplied to the third node N3 and the initialization voltage Vint supplied to the second node N2. For example, the second capacitor C2 may charge the voltage of the data signal and a voltage corresponding to the initialization voltage Vint regardless of a voltage charged in a preceding period (or a preceding frame period) during the first period T1.

During the first period T1, the current supplied from the first transistor M1 may be supplied to the third power line PL3 via the fourth transistor M4 in response to the voltage of the third node N3. Therefore, during the first period T1, the light emitting element LD may be maintained in the non-emission state.

Figure 7:
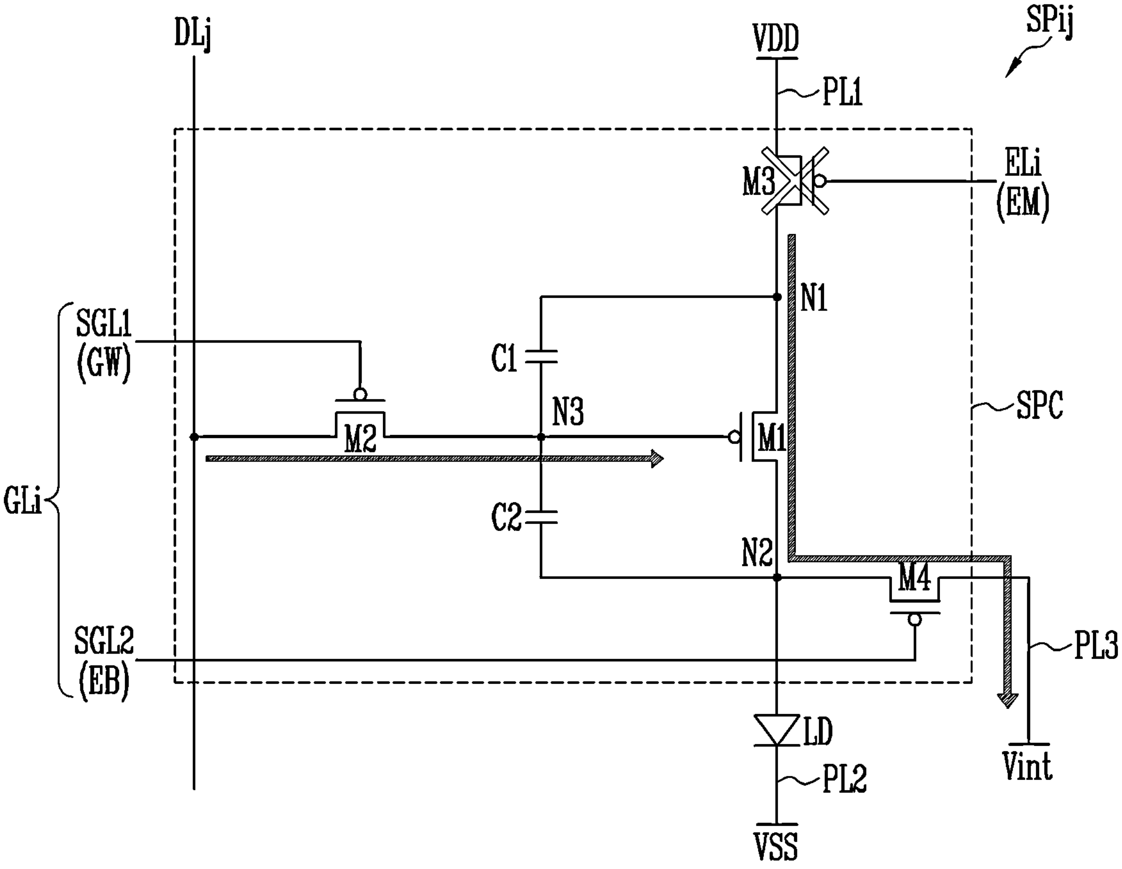

Referring to FIG. 7, during second period T2, the first, second, and fourth transistors M1, M2, and M4 may be maintained in the turn-on state. During the second period T2, an emission control signal EM for setting the third transistor M3 to a turn-off state may be supplied to the emission control line ELi. If the third transistor M3 is turned off, the electrical connection between the first power line PL1 and the first node N1 may be interrupted.

Since the second transistor M2 is set to the turn-on state during the second period T2, the voltage of the data signal is supplied from the data line DLj to the third node N3. In this case, the voltage on the first node N1 may decrease from the first power voltage VDD to a voltage obtained by adding an absolute threshold voltage of the first transistor M1 to the voltage of the data signal.

In other words, during the second period T2, the third node N3 may be set to the voltage of the data signal, and the first node N1 may be set to a voltage obtained by adding the absolute threshold voltage of the first transistor M1 to the voltage of the data signal. Therefore, during the second period T2, the threshold voltage of the first transistor M1 may be stored in the first capacitor C1.

Since the fourth transistor M4 is set to the turn-on state during the second period T2, the current supplied from the first node N1 to the second node N2 via the first transistor M1 may be supplied to the third power line PL3 via the fourth transistor M4. Therefore, during the second period T2, the light emitting element LD may be maintained in the non-emission state.

Figure 8:
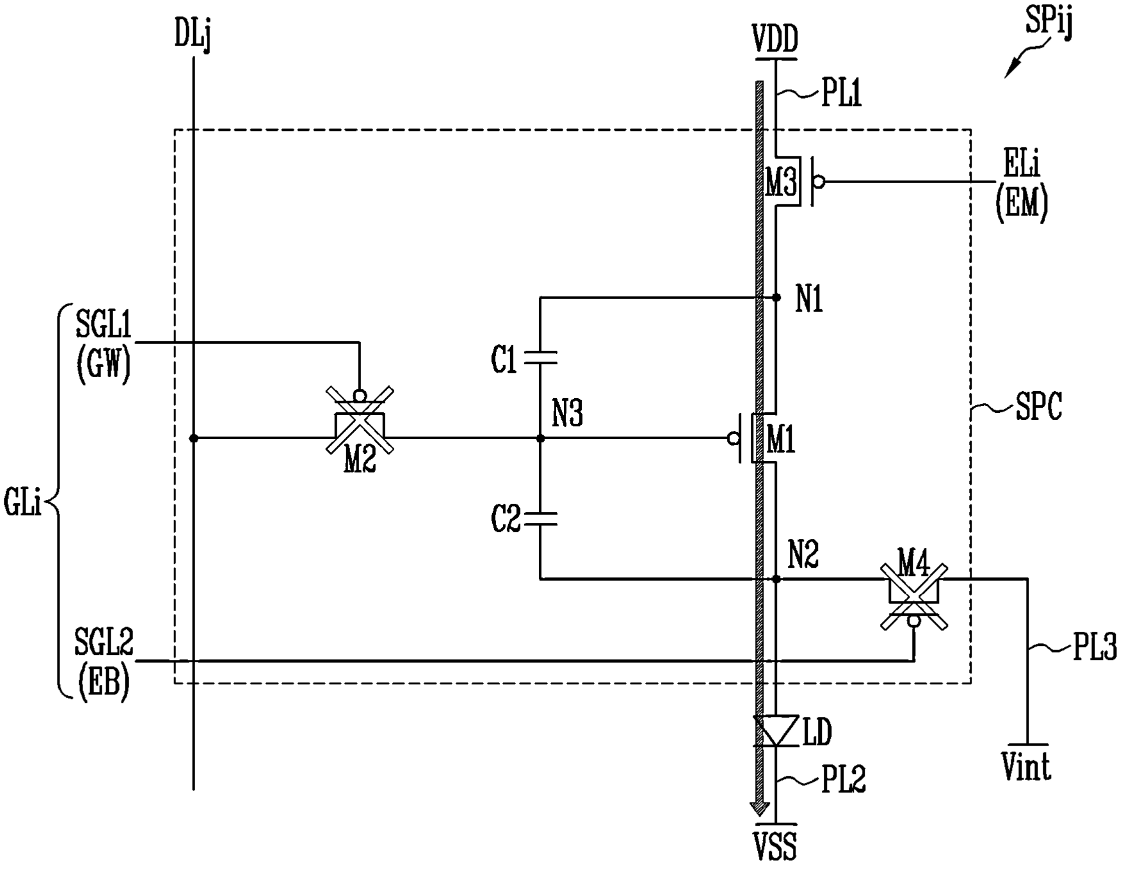

Referring to FIG. 8, during the third period T3, a first sub-gate signal GW for setting the second transistor M2 to a turn-off state may be supplied to the first sub-gate line SGL1. During the third period T3, a second sub-gate signal EB for setting the fourth transistor M4 to a turn-off state may be supplied to the second sub-gate line SGL2. During the third period T3, an emission control signal EM for setting the third transistor M3 to a turn-on state may be supplied to the emission control line ELi.

Here, the first transistor M1 may control, in response to the voltage of the third node N3, the amount of the current to be supplied from the first power line PL1 for the supply of the first power voltage VDD to the second power line PL2 for the supply of the second power voltage VSS via the light emitting element LD. During the third period T3, the light emitting element LD may generate light at a luminance corresponding to the amount of a driving current supplied from the first transistor M1.

Figure 9:
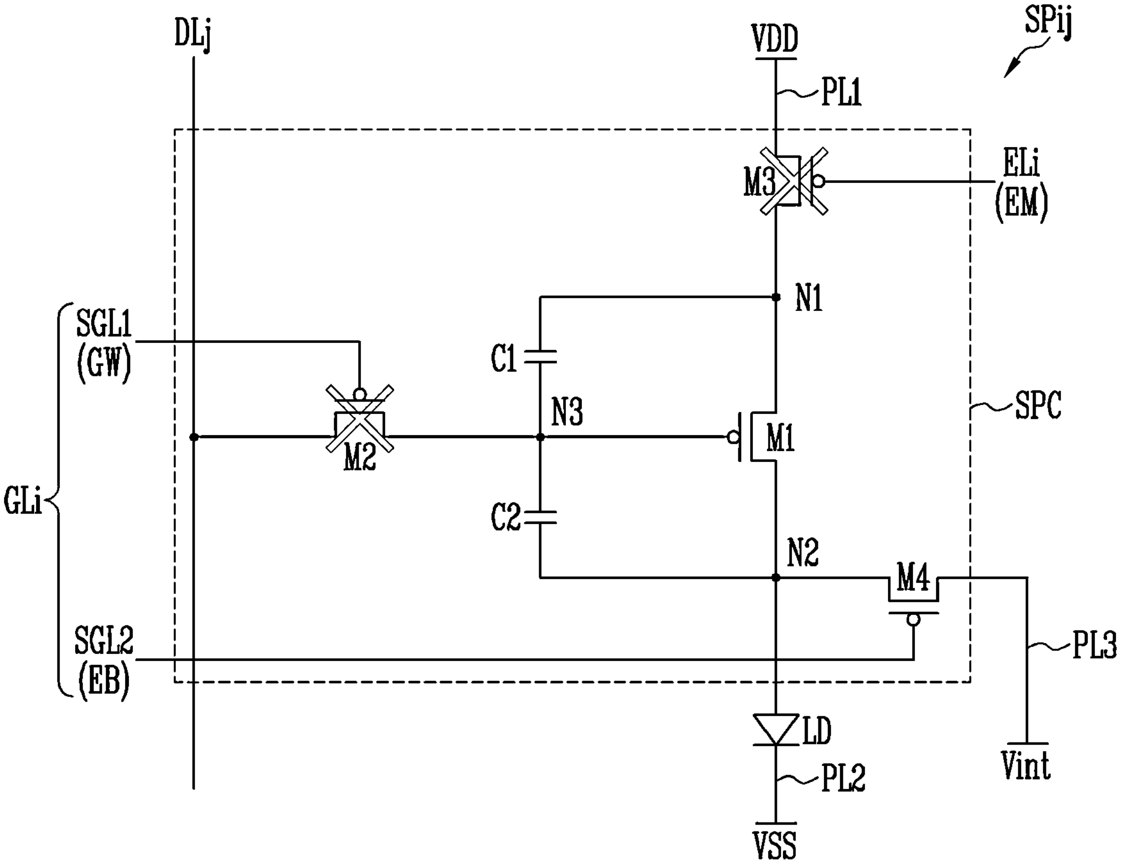

Referring to FIG. 9, during the fourth period T4, the supply of the emission control signal EM for setting the third transistor M3 to the turn-on state to the emission control line ELi is interrupted. Accordingly, the third transistor M3 may be turned off. During the fourth period T4, a second sub-gate signal EB for setting the fourth transistor M4 to a turn-on state may be supplied to the second sub-gate line SGL2. During the fourth period T4, the first sub-gate signal GW for setting the second transistor M2 to the turn-on state is not supplied to the first sub-gate line SGL1. Accordingly, the second transistor M2 may be maintained in the turn-off state.

During the fourth period T4, the second power voltage VSS having the second voltage level V2 may be supplied to the second electrode (i.e., cathode) of the light emitting element LD through the second power line PL2. As the second power voltage VSS having the second voltage level V2 is supplied to the second electrode (i.e., cathode) of the light emitting element LD, charges trapped in the light emitting element LD may be detrapped. As a result, deterioration of the light emitting element LD may be effectively prevented.

Embodiments of the present disclosure may provide a pixel capable of preventing deterioration due to light emission, and a display device including the pixel.

However, effects of the present disclosure are not limited to the above-described effects, and various modifications are possible without departing from the spirit and scope of the present disclosure.

While the spirit and scope of the present disclosure are described by detailed exemplary embodiments, it should be noted that the above-described embodiments are merely descriptive and should not be considered limiting. It should be understood by those skilled in the art that various changes, substitutions, and alternations may be made herein without departing from the scope of the disclosure as defined by the following claims.

The scope of the present disclosure is not limited by detailed descriptions of the present specification, and should be defined by the accompanying claims. Furthermore, all changes or modifications of the present disclosure derived from the meanings and scope of the claims, and equivalents thereof should be construed as being included in the scope of the present disclosure.

What is claimed is:

1. A pixel comprising:

a first transistor including a first electrode connected to a first node, a second electrode connected to a second node, and a gate electrode connected to a third node;

a second transistor connected between a data line and the third node, and including a gate electrode electrically connected to a first sub-gate line;

a third transistor connected between a first power line to which a first power voltage is supplied, and the first node, and including a gate electrode electrically connected to an emission control line;

a fourth transistor including a first electrode connected to the second node, a second electrode electrically connected to a third power line to which an initialization voltage is supplied, and a gate electrode electrically connected to a second sub-gate line; and a light emitting element connected between the second node and a second power line to which a second power voltage is supplied, wherein during an emission period in which the light emitting element emits light at a luminance corresponding to a current supplied from the first transistor, the second power voltage has a first voltage level, wherein during a deterioration prevention period after the emission period, the second power voltage has a second voltage level, wherein the second voltage level is higher than the first voltage level, and wherein during the deterioration prevention period, the third transistor and the second transistor are set to a turn-off state, and the first transistor and the fourth transistor are set to a turn-on state.

2. The pixel according to claim 1, wherein one frame period includes a horizontal period, the emission period, and the deterioration prevention period.

3. The pixel according to claim 2, wherein a start time point of the deterioration prevention period corresponds to an end time point of the emission period, and wherein an end time point of the deterioration prevention period corresponds to an end time point of the frame period.

4. The pixel according to claim 2, wherein the horizontal period includes a first period and a second period, wherein during the first period, the first to the fourth transistors are set to the turn-on state, and wherein, during the second period after the first period, the third transistor is set to the turn-off state, and the first transistor, the second transistor, and the fourth transistor are set to the turn-on state.

5. The pixel according to claim 2, wherein, during the emission period after the horizontal period, the second transistor and the fourth transistor are set to the turn-off state, and the first transistor and the third transistor are set to the turn-on state.

6. The pixel according to claim 2, wherein the second voltage level is higher than a sum of a voltage level of the initialization voltage and a voltage level of a threshold voltage of the light emitting element.

7. The pixel according to claim 2, wherein a ratio of the emission period to the frame period is a value ranging from 0.1 to 0.4.

8. The pixel according to claim 1, wherein each of the first to the fourth transistors comprises a P-type transistor.

9. A pixel comprising:

a first transistor including a first electrode connected to a first node, a second electrode connected to a second node, and a gate electrode connected to a third node;

a second transistor connected between a data line and the third node, and including a gate electrode electrically connected to a first sub-gate line;

a third transistor connected between a first power line to which a first power voltage is supplied, and the first node, and including a gate electrode electrically connected to an emission control line;

a fourth transistor including a first electrode connected to the second node, a second electrode electrically connected to a third power line to which an initialization voltage is supplied, and a gate electrode electrically connected to a second sub-gate line;

a light emitting element connected between the second node and a second power line to which a second power voltage is supplied, a first capacitor connected between the first node and the third node; and a second capacitor connected between the second node and the third node, wherein during an emission period in which the light emitting element emits light at a luminance corresponding to a current supplied from the first transistor, the second power voltage has a first voltage level, wherein during a deterioration prevention period after the emission period, the second power voltage has a second voltage level, and wherein the second voltage level is higher than the first voltage level.

10. A display device, comprising pixels connected to gate lines, data lines, and emission control lines, wherein, among the pixels, a pixel positioned on an i-th pixel row and a j-th pixel column comprises:

a first transistor including a first electrode connected to a first node, a second electrode connected to a second node, and a gate electrode connected to a third node;

a second transistor connected between a j-th data line among the data lines and the third node, and configured to be turned on when a first sub-gate signal having a turn-on level is supplied to a first sub-gate line of an i-th gate line among the gate lines;

a third transistor connected between the first node and a first power line to which a first power voltage is supplied, and configured to be turned on when an emission control signal having the turn-on level is supplied to an i-th emission control line among the emission control lines;

a fourth transistor including a first electrode connected to the second node, and a second electrode connected to a third power line to which an initialization voltage is supplied, and configured to be turned on when a second sub-gate signal having the turn-on level is supplied to a second sub-gate line of the i-th gate line among the gate lines; and a light emitting element connected between the second node and a second power line to which a second power voltage is supplied, wherein i is an integer of 0 or more, and j is an integer of 0 or more, wherein during an emission period in which the light emitting element emits light at a luminance corresponding to a current supplied from the first transistor, the second power voltage has a first voltage level, wherein after the emission period, the second power voltage has a second voltage level, wherein the second voltage level is higher than the first voltage level, and wherein during a deterioration prevention period, the third transistor and the second transistor are set to a turn-off state, and the first transistor and the fourth transistor are set to a turn-on state.

11. The display device according to claim 10, wherein one frame period includes a horizontal period, the emission period, and the deterioration prevention period.

12. The display device according to claim 11, wherein a start time point of the deterioration prevention period corresponds to an end time point of the emission period, and wherein an end time point of the deterioration prevention period corresponds to an end time point of the frame period.

13. The display device according to claim 11, wherein the horizontal period includes a first period and a second period, wherein during the first period, the first to the fourth transistors are set to the turn-on state, and wherein, during the second period after the first period, the third transistor is set to the turn-off state, and the first transistor, the second transistor, and the fourth transistor are set to the turn-on state.

14. The display device according to claim 11, wherein, during the emission period after the horizontal period, the second transistor and the fourth transistor are set to the turn-off state, and the first transistor and the third transistor are set to the turn-on state.

15. The display device according to claim 11, wherein the second voltage level is higher than a sum of a voltage level of the initialization voltage and a voltage level of a threshold voltage of the light emitting element.

16. The display device according to claim 11, wherein a ratio of the emission period to the frame period is a value ranging from 0.1 to 0.4.

17. The display device according to claim 10, wherein each of the first to the fourth transistors comprises a P-type transistor.

18. The display device according to claim 10, wherein the pixel comprises:

a first capacitor connected between the first node and the third node; and a second capacitor connected between the second node and the third node.

* * * * *